United States Patent
Kok et al.

(10) Patent No.: US 7,652,374 B2
(45) Date of Patent: Jan. 26, 2010

(54) SUBSTRATE AND PROCESS FOR SEMICONDUCTOR FLIP CHIP PACKAGE

(76) Inventors: Chi Wah Kok, 7C, Block 4 Uptown Plaza, Tai Po, N.T., Hong Kong (CN); Yee Ching Tam, Flat 2, G/F, 1 Tai Cheong St., Sai Wan Ho, Hong Kong (CN)

( * ) Notice: Subject to any disclaimer, the term of this patent is extended or adjusted under 35 U.S.C. 154(b) by 314 days.

(21) Appl. No.: 11/496,111

(22) Filed: Jul. 31, 2006

(65) Prior Publication Data

US 2008/0023829 A1 Jan. 31, 2008

(51) Int. Cl.
*H01L 23/48* (2006.01)
(52) U.S. Cl. .................. 257/737; 257/739; 257/772; 257/773; 257/774; 257/776; 257/778; 257/779; 257/E23.02; 257/E23.021; 257/E23.069; 438/108; 438/612
(58) Field of Classification Search .......... 257/737, 257/738, 772, 779, E23.021, E23.069; 228/180.22
See application file for complete search history.

(56) References Cited

U.S. PATENT DOCUMENTS

| 5,795,818 | A | 8/1998 | Marrs |
| 6,330,967 | B1 | 12/2001 | Milewski et al. |
| 6,573,610 | B1 | 6/2003 | Tsai |
| 6,787,918 | B1 | 9/2004 | Tsai et al. |
| 6,975,035 | B2 * | 12/2005 | Lee .............................. 257/778 |
| 7,135,770 | B2 * | 11/2006 | Nishiyama et al. .......... 257/734 |

FOREIGN PATENT DOCUMENTS

JP 200487922 A 3/2004

OTHER PUBLICATIONS

Patent Cooperation Treaty, International Search Report, Oct. 25, 2007, 4 pages.

* cited by examiner

*Primary Examiner*—Jasmine J Clark
(74) *Attorney, Agent, or Firm*—Schwabe, Williamson & Wyatt, P.C.

(57) ABSTRACT

A semiconductor package structure for flip chip package includes at least a patterned circuit layer and an insulating layer alternately stacking up each other. The patterned layer includes a plurality of bump pads, and the insulating layer includes a plurality of etching holes. The etching holes and the bump pads are aligned, such that the bump pads are exposed through the etching holes. A plurality of bumps is disposed on the active surface of the chip, which can be obtained by stud bumping. The etching holes are filled with solder paste, and the bumps of the chips penetrate into the solder filled etching holes. Vibration obtained by mechanical equipment, or ultrasonic equipment can be applied to assist the alignment of the bumps to the corresponding bump pads. A reflow process is applied to collapse the solder paste that fills the etching holes to form electrical connection between the bumps and bump pads.

11 Claims, 17 Drawing Sheets

SUBSTRATE AND PROCESS FOR SEMICONDUCTOR FLIP CHIP PACKAGE

BACKGROUND OF THE INVENTION

This invention relates to a substrate for semiconductor flip chip package, and a process to fabricate the flip chip device with the substrate.

Flip chip technology is one of the most frequently used package technology for chip scale package. As the flip chip technology can employ area array to dispose bump pad and be connected to the carrier through a bump, it can reduce the packaging area and shorten the transmission path of the signal. Traditional type of bump pad design of the substrate can be classified into SMD (Solder Mask Defined) type and NSMD (Non-Solder Mask Defined) type. Each of these two types of bump pad design has its own merits and demerits. As a result, there is no verdict on this matter one way or another.

FIGS. 1 and 2 are cross-sectional views of a flip chip package of the NSMD type as an example in the prior art. As shown in FIGS. 1 and 2, a plurality of bumps 110 is formed on the active surface of the chip 120. The chip 120 is to be attached to a substrate 130, and is electrically connected to the substrate 130 through the bump pads 140 by the bumps 110. In general, the substrate 130 is composed of one or more layers of patterned conducting (e.g., copper) foil and insulating layers stacked in an alternating sequence, together with etching holes (not shown) in the insulating layers for interconnecting the patterned conducting layers. The substrate 130 has its surface coated with a solder mask layer 150, and exposes only the bump pads 140 for connection to the bumps of the chip 120.

As shown in FIG. 2, a reflow process is employed in the conventional method to heat the bump 110. The heated bumps 110 will melt and form good bonding with the bump pads 140. As an example, in the case of Pd-Tin bumps, where the bumps 110 will melt at 183° C., the bump will be heated to above 200° C. to obtain a good wetting function to form good bonding with the bump pad. Subsequently, an underfill material (not shown) is employed to fill the space between the chip 120 and the substrate 130 as shown in FIG. 2. This is to protect the bumps 110 from being "fatigue collapse" due to thermal stress resulted from difference between the coefficient of thermal expansion of the chip 120 and that of the substrate 130.

Such bump to bump pad connection method suffers from several problems when there are defects or alignment problems on the chip 120 or the substrate 130. Typical defects include the position offset of either left-offset or right-offset between bumps 110 and the bump pads 140 as shown in FIG. 3, elevation offset between the coplanarity of the substrate 130 to the chip 120 as shown in FIG. 4, or between the bumps 112 as shown in FIG. 5, position offset due to the misalignment between the distribution of the array of the bumps 110 to the distribution of the bump pads 140 on the substrate 130 as shown in FIG. 6 and FIG. 7. The following describes in details the above defects in the flip chip fabricated by conventional process.

As observed in FIG. 3, if there is misalignment of the bumps 110 and bump pads 140 when the chip 120 is placed on the bump pad, there will be position offset problem wherein part of the bumps 110 are unable to touch the bump pads 140, or the bumps 110 are able to touch the bump pads 140 but the contact areas are too small to have a good contact between the bumps 110 and the bump pads 140. In this case, bad solder joint will be formed between the bumps 110 and the bump pads 140 with low electrical conductance, or there are no electrical contact between the bumps 110 and the bump pads 140 at all. In either case, the bumps 110 are said to have been cracked due to the thermal stress in the reflow process.

Similarly, if there are coplanar problem between the chip 120 and the substrate 130, there will be elevation offset between the bumps 110 and the bump pads 140 as shown in FIG. 4. In this case, due to an imperfection 132 in the substrate 140, one or more of the bumps 110 are unable to touch the bump pads 140, or the bumps 110 are able to touch the bump pads 140 but the contact areas are too small to have a good contact between the bumps 110 and the bump pads 140. In this case, bad solder joint will be formed between the bumps 110 and the bump pads 140 with low electrical conductance, or there are no electrical contact between the bumps 110 and the bump pads 140 at all. In either case, the bumps 110 are said to have been cracked due to the thermal stress in the reflow process.

Elevation offset problem can also be caused by non-uniformity in the sizes of the bumps 110. As shown in FIG. 5, one or more of the bumps 112 are too small such that they are unable to touch the bump pads 140, or the bumps 112 are able to touch the bump pads 140 but the contact areas are too small to have a good contact between the bumps 112 and the bump pads 140. In this case, bad solder joint will be formed between the bumps 112 and the bump pads 140 with low electrical conductance, or there are no electrical contact between the bumps 112 and the bump pads 140 at all. In either case, the bumps 112 are said to have been cracked due to the thermal stress in the reflow process.

The position offset can also be caused by the misalignment between the distribution of the array of the bumps 110 to the distribution of the bump pads 140 on the substrate 130 as shown in FIG. 6 (showing a misaligned bump 113 straddling a bump pad 142 and a solder mask portion 152), and FIG. 7 (showing a bump 114 straddling a misaligned bump pad 142 and solder mask portion 152). In these cases, only part of the bumps 110 can be aligned to the bump pads 140, other bumps 110 are unable to touch the bump pads 140, or the bumps 110 are able to touch the bump pads 140 but the contact areas are too small to have a good contact between the bumps 110 and the bump pads 140. In this case, bad solder joint will be formed between the bumps 110 and the bump pads 140 with low electrical conductance, or there are no electrical contact between the bumps 110 and the bump pads 140 at all. In either case, the bumps 110 are said to have been cracked due to the thermal stress in the reflow process FIGS. 14, 15 and 16 are simplified cross sectional side view of prior art flip chips (U.S. Pat. No. 6,975,035) illustrating a chip attached to a substrate, wherein the bumps are substantially inserted into the recesses of the substrate with different mounting method. The bumps 110 in FIG. 14 are directly bonded to the metallic pads of the substrate, whereas the bumps 110 in FIG. 15 were coated with conductive paste 170 before being inserted into the recesses and interconnections are formed between the conductive paste and the pads. In FIG. 16, the conductive paste 170 is deposited onto the pads instead of the bumps, and interconnections are formed between the bumps 110 and the conductive paste 170. The package structure as shown in FIG. 14 does not solve the potential elevation offset problem as depicted in FIG. 4. Mounting method illustrated in FIGS. 15 and 16 solves the noncoplanarity problem introduced by inconsistent bump height and imperfection of the substrate, but the potential risk of positional offset as observed in FIG. 3 is still exist. For FIG. 15, the conductive paste 170 cannot spread over the exposed area of the pads. And for FIG. 16, only part of the bump surface is contacting the conductive paste 170. The conducting areas in both cases are small and thus the solder joint reliability is low. Also, splitting of conductive paste 170 onto the surface of the substrate 130 would occur when the bumps 110 are inserted into the recesses in FIG. 16.

SUMMARY OF THE INVENTION

The invention is aimed at providing a substrate for flip chip package and a process to fabricate the flip chip device, where the fabrication of the flip chip has large tolerance of chip to substrate co-planar offset, position offset, and accuracy of alignments of the bumps on the chip, and etching holes (bump pads) on the substrate. The fabricated flip chip package has an increased contact area between the bumps and the bump pads, thus increase the solder joint reliability, and hence the yield and reliability of the package.

In order to attain the foregoing and other objectives, the present invention provides semiconductor package structure for flip chip package that includes at least a plurality of patterned circuit layers which can be copper or other conductive materials, and an insulating substrate, which can be polymide or other insulating materials, alternately stacking up each other. The patterned circuit layers are electrically connected with each other, wherein one of the patterned circuit layers is positioned on the surface of the substrate. The patterned circuit layer includes a plurality of bump pads. The substrate that covers the patterned circuit layer is etched to form holes which expose the bump pads to the chip. In another embodiment, the sidewall of the etching holes of the substrate can be electrically plated with copper, or other conductive materials to help to increase the contact area between the chip and the bump pads as discussed in the following.

According to an illustrative embodiment of the present invention, the etching holes are filled with solder paste. The chip is studd|$_{[.1]}$ bumpedstud or bumped with other technique. The flip chip package is formed by having the bumps on the chip penetrate into the etching holes filled with solder paste. Therefore, after a reflow process, the contact area between the bumps and the bump pads is not limited to the top surface of the bump pads, but the contact area also include the interior surfaces of the etching holes. The contact area between the bumps and the bump pads also includes the side surfaces of the etching holes. Since the contact area between the bumps and the bump pads increases, the solder joint reliability can be improved and the yield and the reliability of the package can also be improved.

BRIEF DESCRIPTION OF THE DRAWINGS

Illustrative embodiments of the invention will be described by way of example and with reference to the accompanying drawings, in which.

DETAILED DESCRIPTION OF ILLUSTRATIVE EMBODIMENTS

Figure 1:
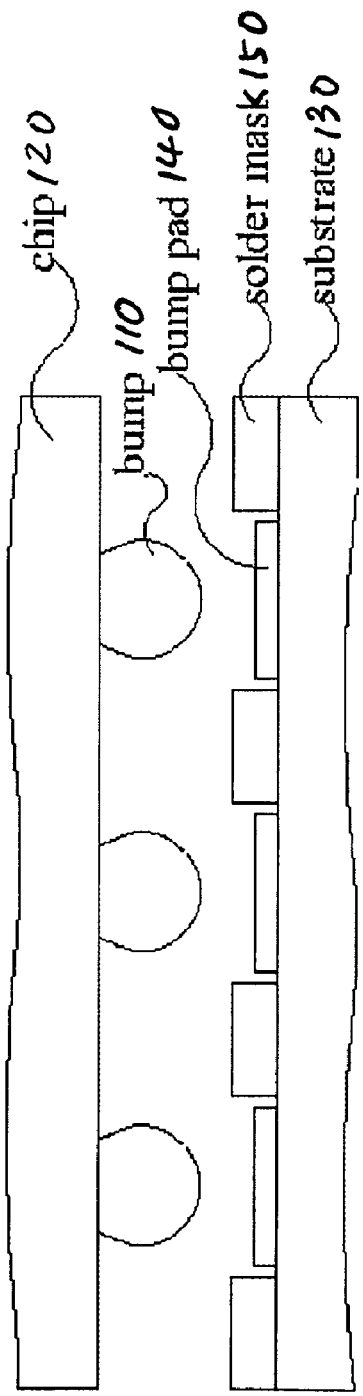
FIG. 1 is a cross-sectional view of a flip chip package in NSMD form according to an example of the prior art with a bumped chip and a substrate with bump pads ready to be form electrical connection.
Figure 2:
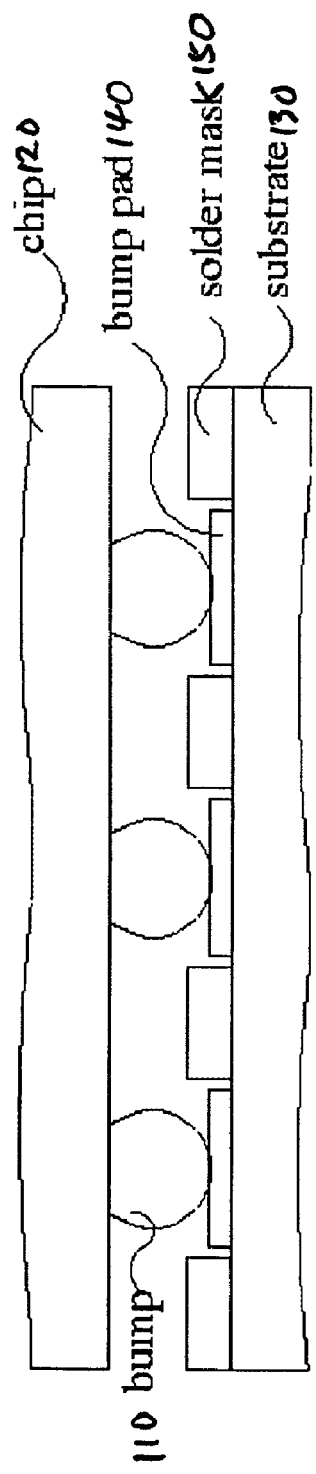
FIG. 2 is a cross-sectional view of a flip chip package in NSMD form according to an example of the prior art with the bumps of the chip electrically connected to the bump pads of the substrate.
Figure 3:
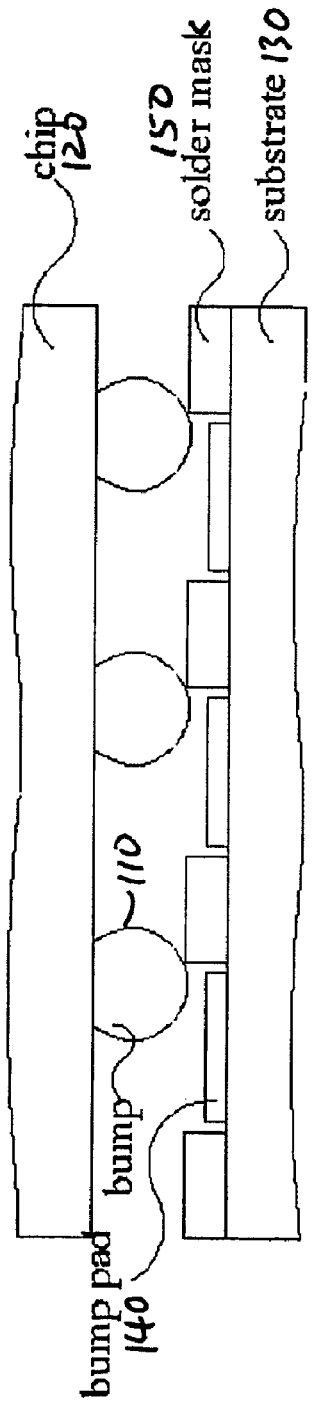
FIG. 3 is a cross-sectional view of a flip chip package in NSMD form according to an example of the prior art that suffers from position offset problem with misalignment between the bumps on the chip and the bump pads on the substrate.
Figure 4:
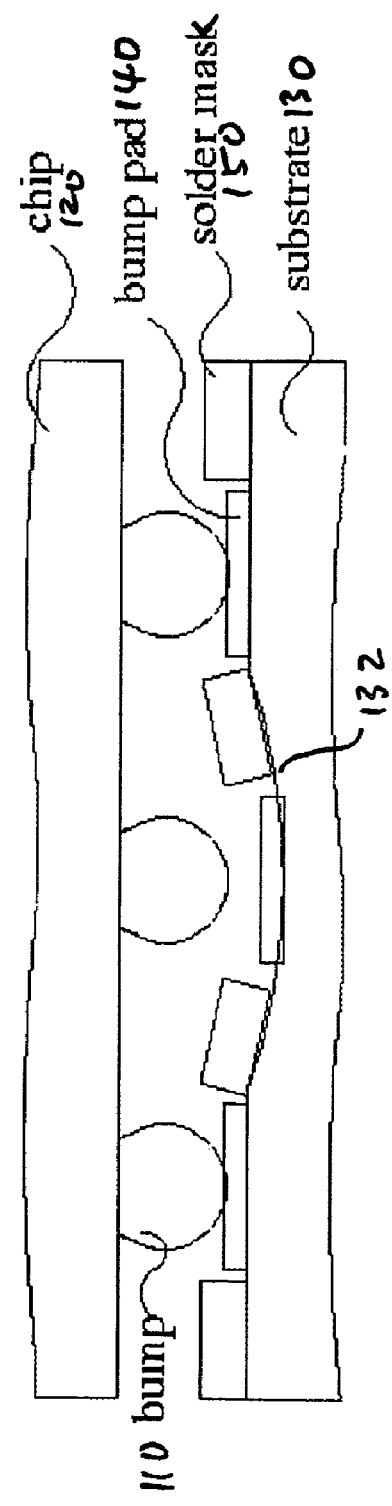
FIG. 4 is a cross-sectional view of a flip chip package in NSMD form according to an example of the prior art that suffers from elevation offset problem with a defective substrate.
Figure 5:
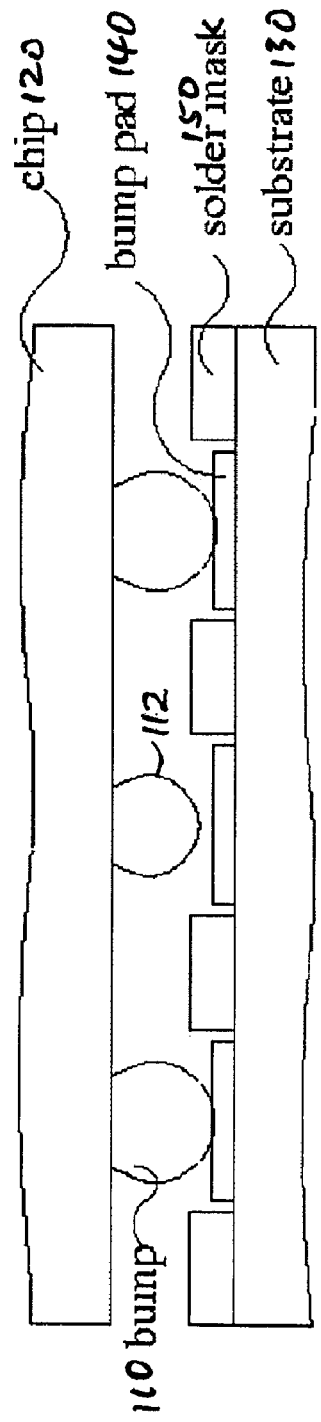
FIG. 5 is a cross-sectional view of a flip chip package in NSMD form according to an example of the prior art that suffers from elevation offset problem with nonuniform ball size of the bump on the chip.
Figure 6:
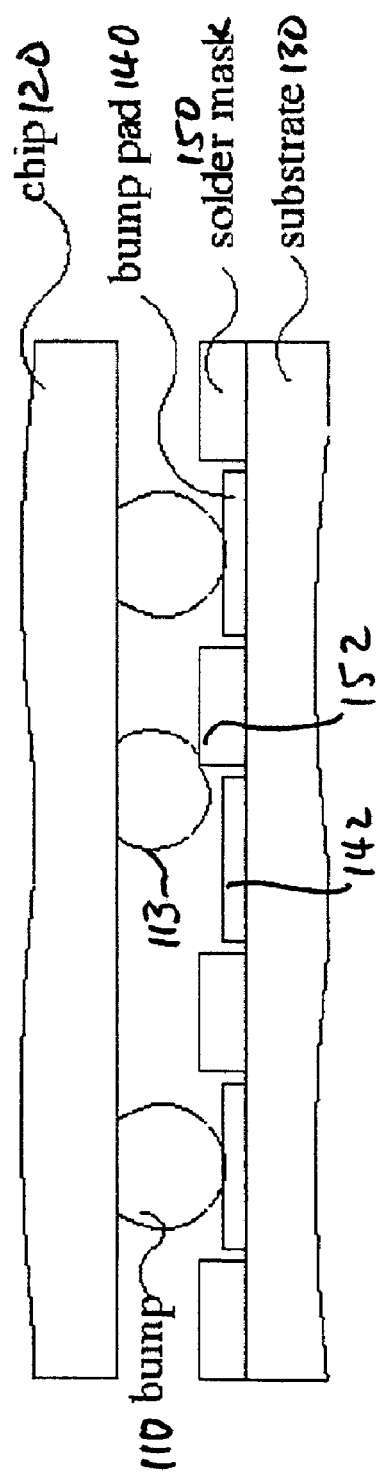
FIG. 6 is a cross-sectional view of a flip chip package in NSMD form according to an example of the prior art that suffers from position offset problem with nonuniform bump distribution on the chip.
Figure 7:
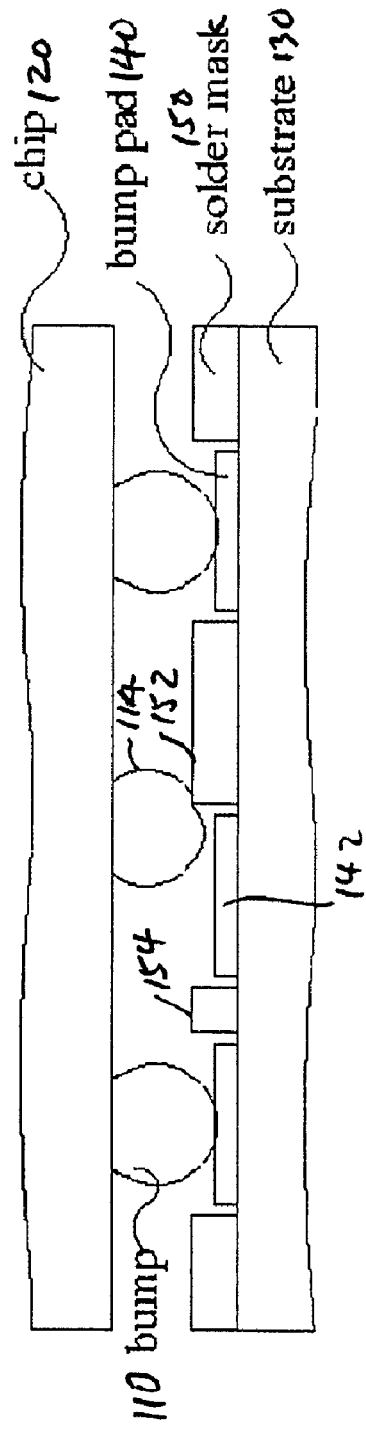
FIG. 7 is a cross-sectional view of a flip chip package in NSMD form according to an example of the prior art that suffers from position offset problem with nonuniform bump distribution on the substrate.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

This application discloses a new way to form electrical connection between the bumped chip and the patterned circuit layer of the substrate. As will be discussed regarding the illustrative embodiments of the present invention, most of the fabrication problem in flip chip can be relieved by using a simple process discussed in this invention.

Figure 8:
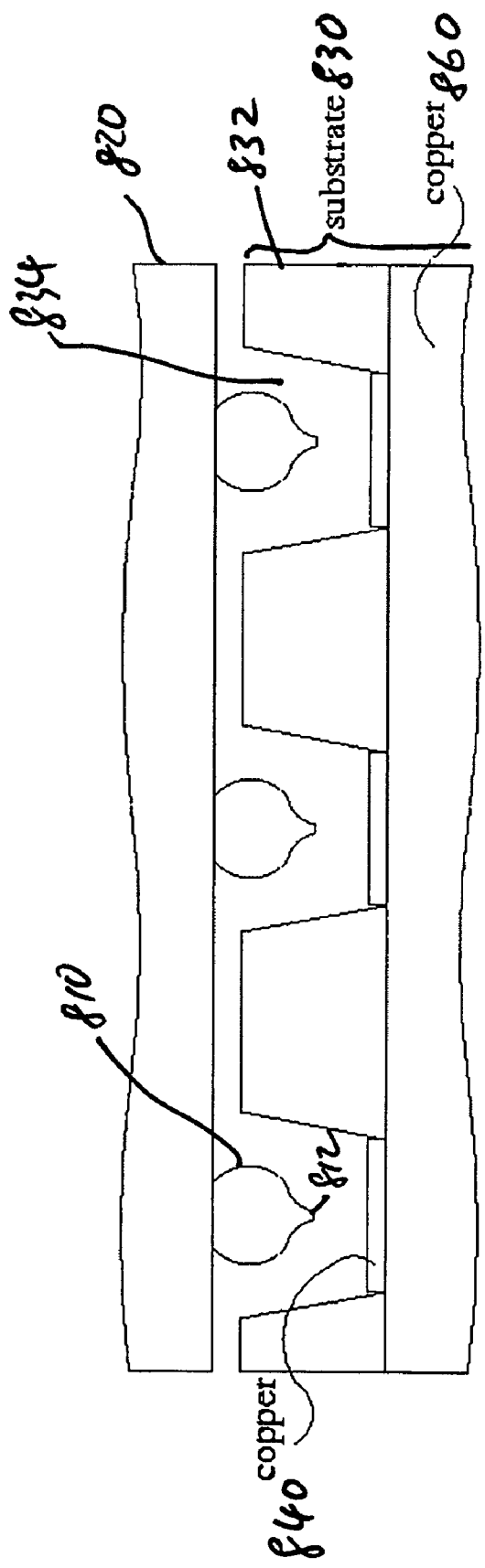
FIG. 8 is a cross-sectional view of a flip chip package according to an illustrative embodiment of the present invention.
Figure 9:
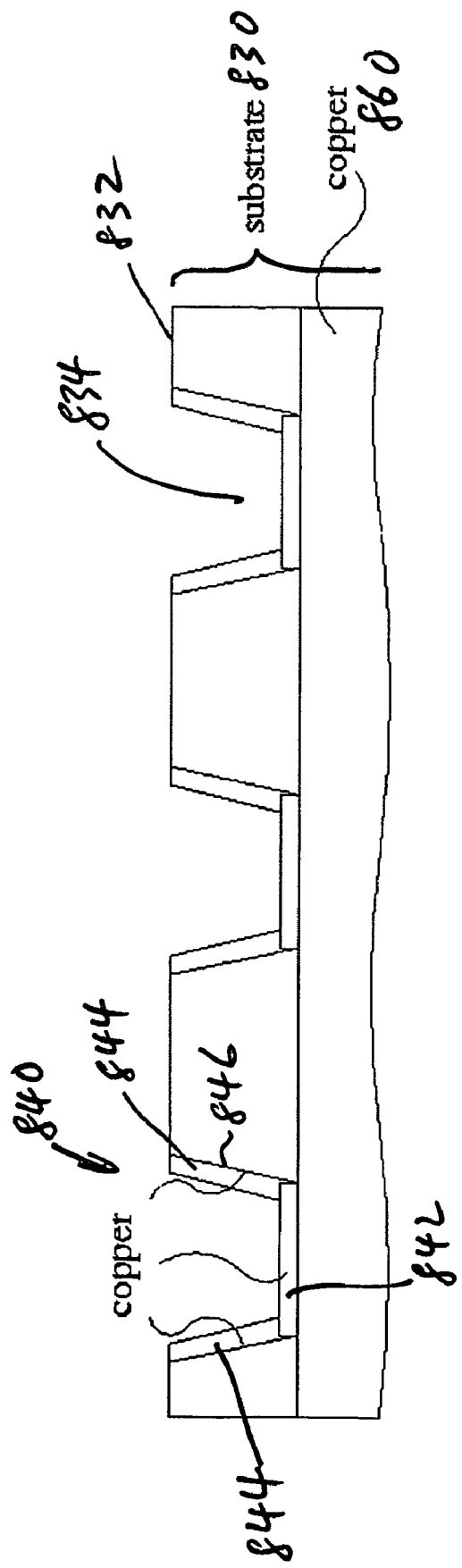
FIG. 9 is a cross-sectional view of a flip chip package according to another embodiment of the present invention with the sidewall of the etching holes plated with copper that electrically connect to the bump pads.

FIG. 8 is a cross-sectional view of disclosed flip chip substrate taking copper as an example to form the patterned circuit layer according to an illustrative embodiment of the invention. As shown in FIG. 8, the substrate 830 is formed by an insulating core 832 layer on top of a patterned conductive circuit layer 860. Additional insulating layers and conductive circuit layers stacked in an alternating sequence can be included in the substrate 830. The top insulating layer 832 on the surface of the substrate includes a plurality of etching holes 834. The etching holes can be formed by patterning and chemical etching, or any other holes forming technique such as punching, mechanical drilling or laser drilling. At the bottom of the etching holes are bump pads 840, and the sidewalls 846 of the etching holes 834 can also be coated with a conductive layer 844 (e.g., copper), as shown in FIG. 9, by any metal buildup or coating techniques well-known in the art such as electroplating after masking the substrate by photoresist or after electroless plating/deposit of a seed metal layer onto the inside wall of the hole. For example, a variety of well-known processes in plated through-hole ("PTH") technology can be used to plate the sidewalls 846 with a conductive layer 844$_{[.2]}$. The etching holes 834 expose the bump pads 840 for electrical connection with the chip 820.

Figure 10:
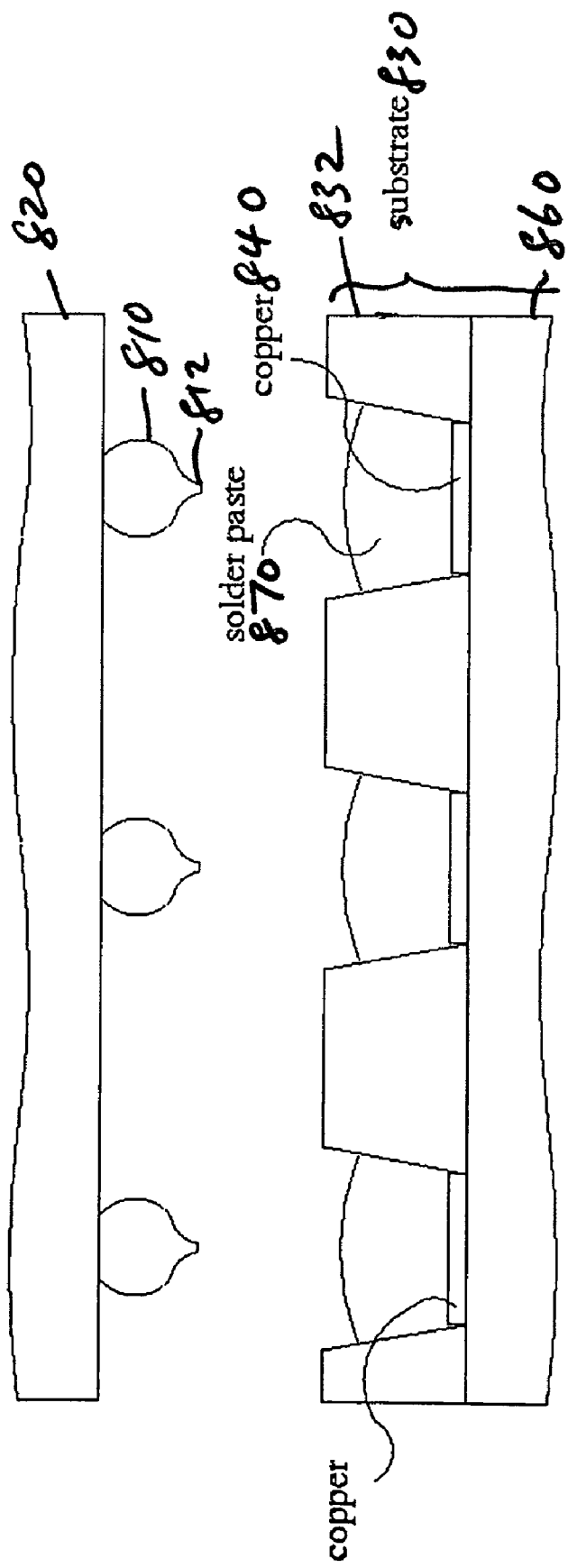
FIG. 10 is a cross-sectional view of a flip chip package according to another embodiment of the present invention with the etching hole filled with solder paste.

In connecting the chip to the substrate, first, the etching holes 834 are filled with a solder paste 870, as shown in FIG. 10. The chip 820 is stud bumped on its active surface in this illustrative embodiment of the invention as shown in FIG. 10. That is, each bump 810 has a small protrusion 812 at the tip.

It is noted that in the illustrative embodiment, the etching holes 834 have sufficient capacity to accommodate enough solder paste 870 to ensure adequate electrical contact between the solder bumps 810 and solder bump pads 840 throughout the range of acceptable defects such as position offset due to miss-alignment or non-uniform distribution, and elevation offset due to lack of coplanarity of the chip and substrate. For example, the etching holes 834 in the illustrative embodiments have a depth that is approximately the same as the width of the bump pads 840. And the depth of the etching holes in the prior art is comparable to the height of the bumps. Other suitable depths can be used. Alternatively, the depth of the etching hole 840 can be designed based on the intended sizes of the bumps 810 to be attached to the substrate 830. For example, a depth of between about 0.5 to about 1.5 times the diameter of the bumps 810 can be used. As another example, a depth of between about 0.7 to about 1.2 times the diameter of the bumps 810 can be used. From yet another perspective, the holes 834 in the illustrative embodiment have sufficient depth to permit the solder paste to immerse a significant portion (e.g., one half of the height of the bumps) of the bumps 810 after the solder paste is collapsed in the reflow process.

Figure 11:
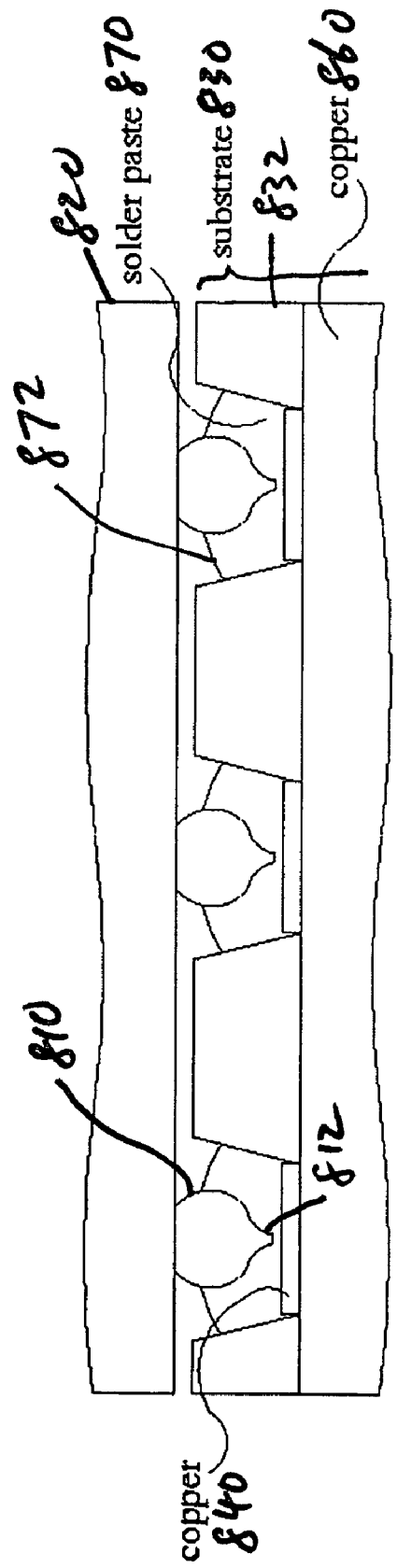
FIG. 11 is a cross-sectional view of a flip chip package according to another embodiment of the present invention with the bumped chip penetrates into the solder paste filled etching holes of the substrate.

Next, initial (i.e., pre-reflow) contact between the chip 820 and the substrate 830 is formed by having the stud bump 810 of the chip 820 penetrate into the solder paste 870 that fill etching hole 834 as shown in FIG. 11.

Figure 12:
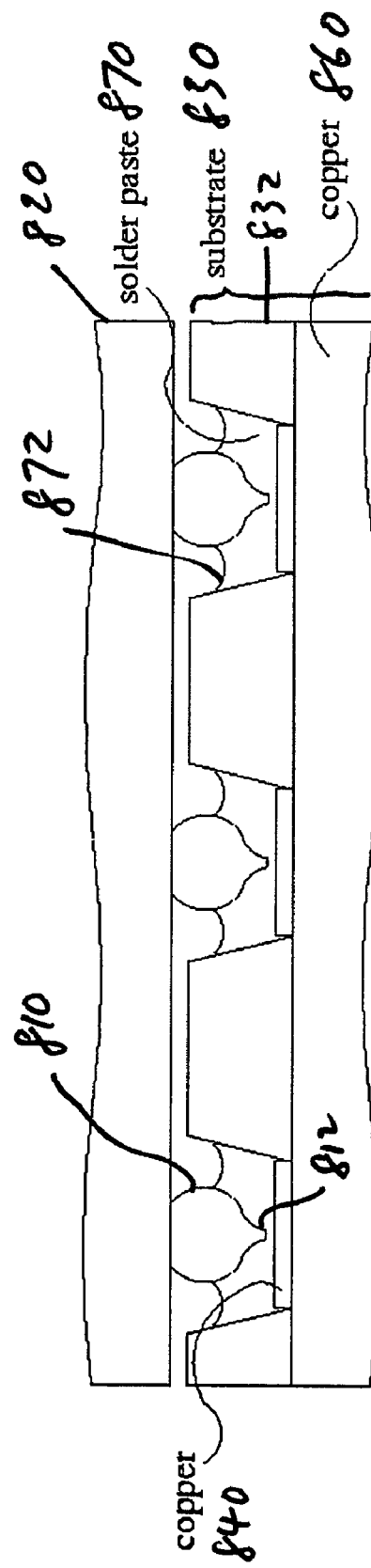
FIG. 12 is a cross-sectional view of a flip chip package according to another embodiment of the present invention with the bumped chip penetrates into the solder paste filled etching holes of the substrate after a reflow process that collapse the solder paste to form electrical connection between the bumps of the chip and the bump pads.

A reflow process is then performed on the chip 820 attached substrate 830 to melt the solder paste 870, such that the melted solder paste 870 collapses (as indicated by the change in shape of the surface 872 of the solder paste 870 between FIGS. 11 and 12) to fill the etching hole FIG. 12. In this way, the electrical conduction between each of the bumps 810 and each of the bump pads 840 is therefore ensured to a higher degree than the prior art due to the increased certainty of adequate contact area via the solder paste 870. Therefore, the solder joint reliability is improved, with the resultant decrease in the electrical contact resistance between the bumps 810 and the bump pads 840. Furthermore, position offset problems due to miss-alignment, or nonuniform distribution, and elevation offset problems due to coplanarity of the chip and substrate, or the bumps can be alleviated.

The insulating layer 832 can be made of any insulating material suitable for flip-chip packaging. For example, a polyimide can be used. Other materials, such as high temperature insulating materials can also be applied to form the substrate. Examples include Bismaleimide-Taiazine (BT), (Flame Resistant) FR-4 and FR-5. The conductive layer 860, bump pads 840 and conductive inner walls 844 can be made from any suitable conductive materials for flip-chip packaging. For example, copper, gold, nickel or a combination of them can be used.

Figure 13:
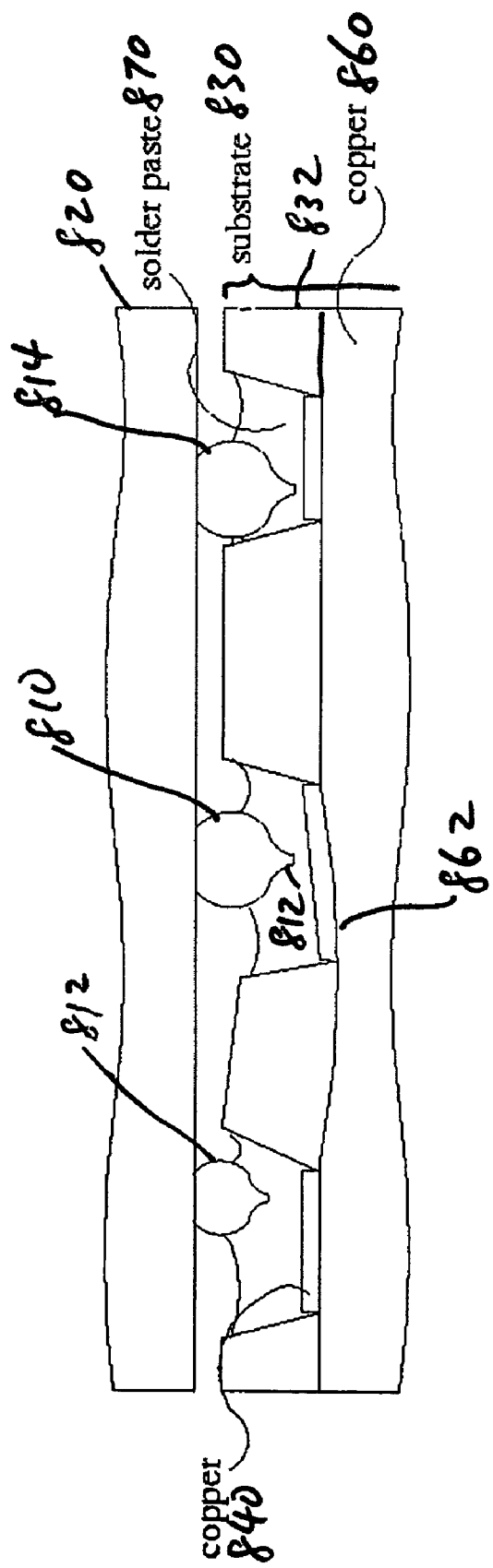
FIG. 13 is a cross-sectional view of a flip chip package according to another embodiment of the present invention with the bumped chip penetrates into the solder paste filled etching holes of the substrate after a reflow process that collapse the solder paste to form electrical connection between the bumps of the chip and the bump pads, where the bumps on the chips and the bump pads on the substrate exhibit various forms of non-uniformity.
Figure 16:
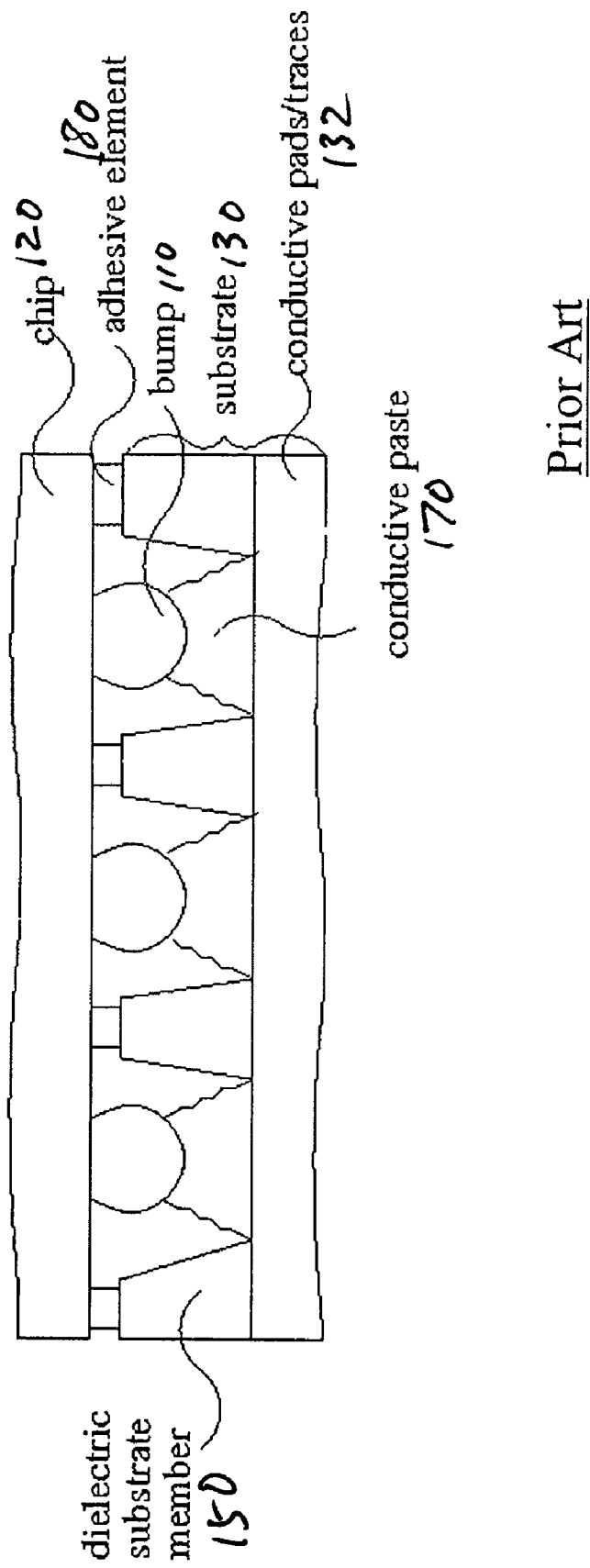
FIG. 16 is a cross sectional view of a flip chip package according to an example of prior art for which the bumps attached to the chip are substantially inserted into the recesses of the substrate using another mounting method.

The above-mentioned advantages of the disclosed substrate structure and chip structure is demonstrated in FIG. 13, which is a cross-sectional view showing chips and substrate that suffer from position offset, elevation offset, and elevation offset due to nonuniform stud bump size, and position offset due to miss alignment in the distribution of the bumps 810 and bump pads 840. Differing from the prior art for which the etching holes are only slightly larger than the bumps, the present invention provides adequate design margins of the etching holes 834. For example, the width of etching holes 834 is about twice the diameter of the stud bump 810, such that all the bumps 810 can penetrate into the etching holes 834, with sufficient tolerance for lateral alignment variations contemplated. Other relative sizes can be used. For example, the width of the etching holes 834 can be from about 1.5 times to about 2.5 times the diameter of the stud bump 810. In FIG. 16 (U.S. Pat. No. 6,975,035), only the tip of the bumps are interconnected with the conductive paste after reflow process. Unlike the prior art, the solder paste 870 that fills the etching holes 834 is collapsed after the reflow process and forms good contacts with the bumps 810 and bump pads 840. Also, the stud bumps in the present invention are intentionally formed with elongated lead, such that elongated part of the bump will be completely emerged into but not only partly contacting with the solder paste as illustrated in the prior art.

Since the stud bumps size to etching holes size ratio in the illustrative embodiment is comparatively smaller to the prior arts, there will be no splitting of solder paste out of the etching holes onto the substrate surface when the bumps penetrate into the solder paste.

Figure 14:
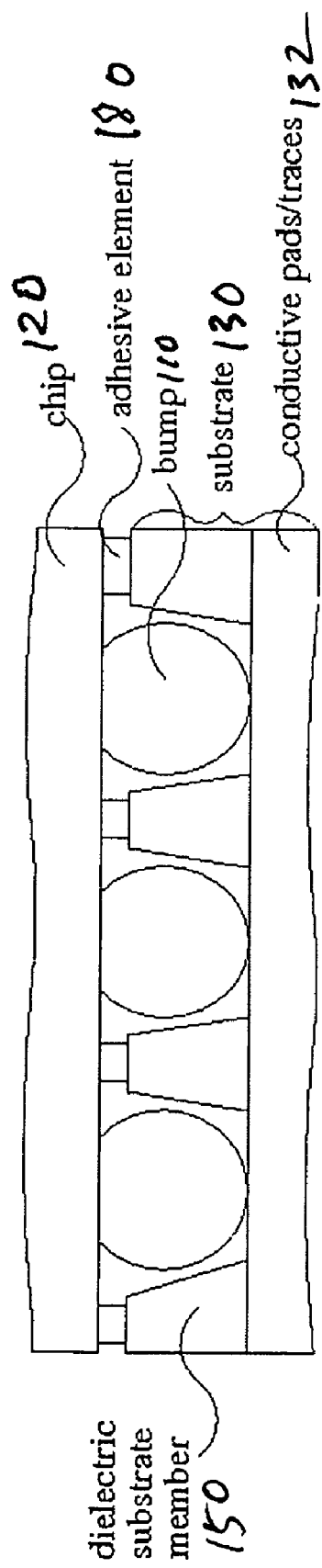
FIG. 14 is a cross sectional view of a flip chip package according to an example of prior art for which the bumps attached to the chip are substantially inserted into the recesses of the substrate.
Figure 15:
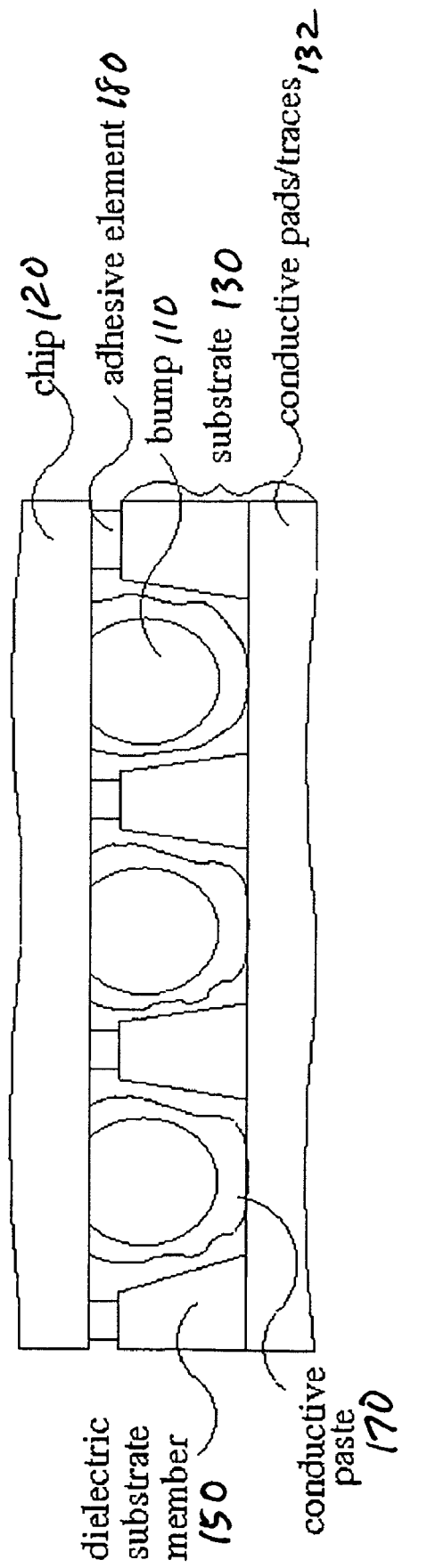
FIG. 15 is a cross sectional view of a flip chip package according to an example of prior art for which the bumps attached to the chip are substantially inserted into the recesses of the substrate using another mounting method.

In the prior art as shown in FIGS. 14, 15 and 16, adhesive element 180 or conductive paste 170 is used as a height controller for the attachment of the chip to the substrate. In one example, the height of attachment is predetermined and controlled by the flip chip bonder. This insertion method is not accurate since there is no mechanical feedback and thus the machine cannot adjust the insertion height to compensate for the non-uniformity of the substrates. In another example, the bumps 110 will be inserted into the etching holes until the chip surface contacts the substrate surface. In one other example, the depth of the etching holes will not be as deep as mentioned such that the tips of the stud bumps 110 can contact the conductive pads when they are being inserted into the etching holes. The insertion methods of the later two embodiments are more accurate than the first one. In these two methods, the machine can detect the stress when the substrate surface contacts the chip surface or the tips of the stud bump contacts the surface of the bond pads.

In addition, an underfill material (not shown) is filled between the chip and the substrate to protect the bump from being cracked due to fatigue collapse caused by thermal stress because of the difference in the coefficient of thermal expansion between the chip and the substrate.

Figure 17:
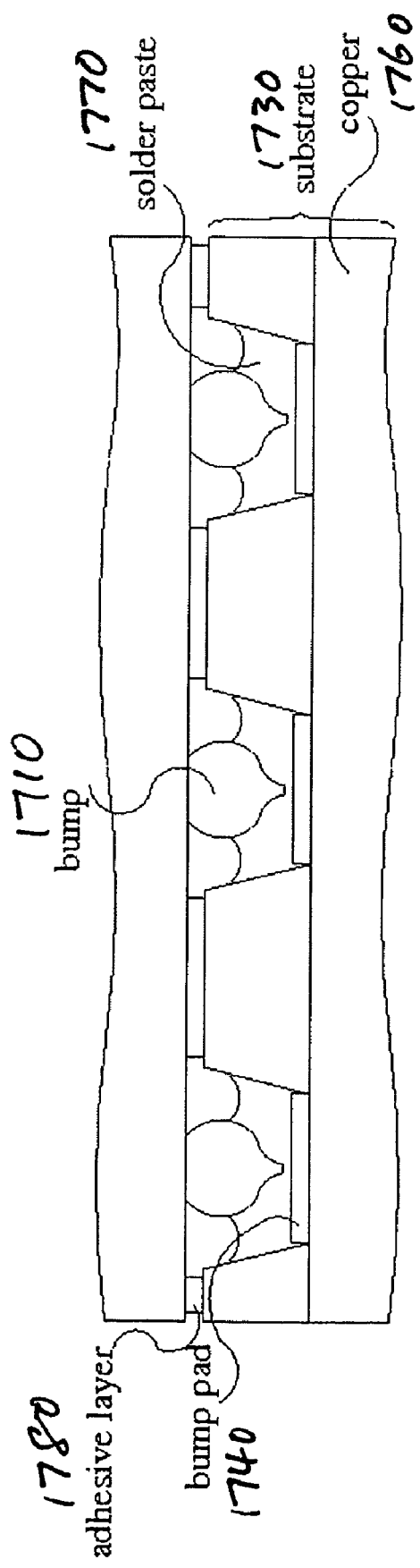
FIG. 17 is a cross-sectional view of a flip chip package in another embodiment of the invention.

In another embodiment of the invention as shown in FIG. 17, an adhesive layer 1780 is included in between the chip and the substrate 1730 to further compensate for the irregularities of the substrate 1730 and act as a height controller for the attachment of the chip to the substrate 1730. The added adhesive layer 1780 will also function as the interconnecting agent between the chip an the substrate 1730, such that the chip is glued onto the substrate 1730 by both the adhesive layer 1780, and also by the bonding formed between the solder paste 1770 and the stud bump 1710. Noted that other type of adhesive techniques can be applied to provide extra strength to glue the chip onto the substrate, which will be aligned with the presented embodiment. Noted that in the case of having an extra layer of adhesive material between the chip and the substrate, it will not be necessary to underfill between the chip and the substrate.

Thus, in the illustrative embodiments of the invention, the substrate for flip chip package of the present invention increases the contact area between the bumps and the bump pads to improve the solder joint reliability and the yield of the product, as well as increase the reliability. Moreover, the tolerance in the alignment accuracy is improved due to the bumps penetrating into the etching holes filled with solder paste, which collapse during reflow. The area of contact between the bumps and the bump pads is increased, and the adverse impact to the solder joint due to the coplanar error, or position error is reduced. Therefore, the problems of poor contacts between the bumps and the bump pads, and associate large electrical contact resistance is effectively addressed. Consequently, the yield and the quality are also improved.

Another advantage of the invention is that as the tolerance of the accuracy of alignment between the bumps and the bump pads enhanced, it become easier to align the bumps on the chips with the etching holes (bump pads) on the substrate. This is because with a smaller pressure need to be applied to the chip, it is highly probable that the stressed chip will fall into the etching hole in a similar manner as that discussed in U.S. Pat. No. 6,573,610, which is incorporated herein by reference. To further reduce the alignment problem, small vibrations, such as ultrasonic vibrations can be applied to the attached chip, such that the vibrating chip will have energy to move around on the surface of the substrate, but when it has penetrated into the etching hole, it will not have enough energy to escape from the etching hole. The probability of obtaining attached chips with substrates that are aligned is thus enhanced.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A semiconductor electronic package, comprising:
a circuit chip having an active surface;
a plurality of solder bumps disposed on the active surface;
a solder paste; and
a substrate, including:
a first patterned conductive circuit layer comprising a plurality of solder bump pads; and
a first insulating layer covering the first patterned conductive circuit layer and defining a plurality of holes exposing the solder bump pads, wherein inside walls of the holes are conductive;
wherein:
the solder paste is disposed inside the holes;
the circuit chip is positioned with the active surface facing the holes in the first insulating layer so that each of the solder bumps is substantially aligned with a corresponding solder bump pad through a corresponding hole;
each solder bump penetrates into the solder paste inside the corresponding hole and electrically connects to the corresponding solder bump pad; and
the solder paste fills in a space between each of the solder bumps and the conductive inside walls of the corresponding holes thereby increasing contact area between the solder paste and the inside walls.

2. The package of claim 1, wherein the solder bumps comprise stud bumps.

3. The package of claim 2, wherein:
a diameter of each of the solder bumps is positioned in a direction substantially parallel to the substrate;
each corresponding hole has a diameter in a direction substantially parallel to the diameter of the solder bumps; and
the diameter of the holes is at least about twice the diameter of the solder bumps.

4. The package of claim 3, wherein the circuit chip is bonded to the substrate by an adhesive.

5. The package of claim 1, wherein the substrate further comprises:
a plurality of additional patterned conductive circuit layers; and
a plurality of additional insulating layers;
wherein:
the additional patterned conductive circuit layers and the additional insulating layers are layered in an alternating sequence;
at least a portion of each additional patterned conductive circuit layer is electrically coupled to a portion of an adjacent additional patterned conductive circuit layer via a conductor at least partially disposed through an intervening additional insulating layer; and
the first patterned conductive circuit layer is disposed on top of the plurality of additional patterned conductive circuit layers and the plurality of additional insulating layers.

6. The package of claim 1, wherein the insulating layer comprises Bismaleimide-Taiazine (BT) or flame resistant FR-4 or FR-5.

7. The package of claim 1, wherein the first patterned conductive circuit layer, the solder bump pads and the conductive inside walls comprises copper, gold, nickel, or a combination thereof.

8. A method, comprising:
forming a first patterned conductive circuit layer including a plurality of solder bump pads;
forming a first insulating layer covering the first patterned conductive circuit layer and having a plurality of holes to expose the solder bump pads, wherein each of the holes is positioned to accommodate at least a portion of a corresponding one of a plurality of solder bumps of a circuit chip, and wherein each of the holes includes a conductive inside wall;

filling the holes with conductive solder paste;

attaching the solder bumps on the circuit chip to the first patterned conductive circuit layer by having the solder bumps penetrate the solder paste inside the corresponding hole and electrically connect to the corresponding solder bump pad; and melting the solder paste to cause the solder paste to collapse and fill in a space between each of the solder bumps and the conductive inside walls of the corresponding holes thereby increasing contact area between the solder paste and the inside walls.

9. The method of claim 8, further comprising:

forming a plurality of additional patterned conductive circuit layers; and forming a plurality of additional insulating layers;

wherein the additional patterned conductive circuit layers and the additional insulating layers are layered in an alternating sequence;

wherein at least a portion of each additional patterned conductive circuit layer is electrically coupled to a portion of an adjacent additional patterned conductive circuit layer via a conductor at least partially disposed through an intervening additional insulating layer; and wherein the first patterned conductive circuit layer is disposed on top of the plurality of additional patterned conductive circuit layers and the plurality of additional insulating layers.

10. The method of claim 8, wherein each of the holes has a diameter in a direction substantially parallel to the diameter of the solder bumps, and wherein the diameter of the holes is at least about twice the diameter of the solder bumps.

11. The method of claim 8, farther comprising forming an adhesive layer on the first insulating layer, wherein the adhesive layer is patterned in accordance with the holes in the first insulating layer to expose the solder bump pads.

* * * * *

UNITED STATES PATENT AND TRADEMARK OFFICE
CERTIFICATE OF CORRECTION

| | | |
|---|---|---|
| PATENT NO. | : 7,652,374 B2 | Page 1 of 1 |
| APPLICATION NO. | : 11/496111 | |
| DATED | : January 26, 2010 | |
| INVENTOR(S) | : Kok et al. | |

It is certified that error appears in the above-identified patent and that said Letters Patent is hereby corrected as shown below:

On the cover page, (*) Notice: Subject to any disclaimer, the term of this patent is extended or adjusted under 35 U.S.C. 154(b) by 314 days.

Delete the phrase "by 314 days" and insert --by 493 days--.

In column 10, line 14, "farther comprising forming" should read --further comprising forming--.

Signed and Sealed this

Tenth Day of August, 2010

David J. Kappos
*Director of the United States Patent and Trademark Office*